United States Patent [19]
Tan et al.

[11] Patent Number: 5,922,843
[45] Date of Patent: *Jul. 13, 1999

[54] ANALOG BACTERIORHODOPSIN MOLECULES

[75] Inventors: Eric Hock Lye Tan; Robert R. Birge, both of Syracuse, N.Y.

[73] Assignee: Syracuse University, Syracuse, N.Y.

[ * ] Notice: This patent issued on a continued prosecution application filed under 37 CFR 1.53(d), and is subject to the twenty year patent term provisions of 35 U.S.C. 154(a)(2).

[21] Appl. No.: 08/731,328

[22] Filed: Oct. 15, 1996

[51] Int. Cl.$^6$ ..................................................... C07K 13/00
[52] U.S. Cl. ........................... 530/350; 530/825; 365/106; 365/112; 365/215; 365/234; 369/100
[58] Field of Search .................... 530/350, 825; 365/106, 112, 215, 234; 369/100

[56] References Cited

U.S. PATENT DOCUMENTS

| | | | |
|---|---|---|---|
| 4,032,901 | 6/1977 | Levinthal | 340/173 NC |
| 4,713,795 | 12/1987 | Woike et al. | 365/119 |
| 4,866,672 | 9/1989 | Terao et al. | 365/151 |
| 5,228,001 | 7/1993 | Birge et al. | 365/215 |
| 5,253,198 | 10/1993 | Birge et al. | 365/106 |
| 5,518,858 | 5/1996 | Dyukova et al. | 430/167 |
| 5,559,732 | 9/1996 | Birge | 365/120 |

OTHER PUBLICATIONS

Birge et al., Book of Abstracts, 212th ACS National Meeting, Orlando, FL., abstract, Aug. 1996.

Wu et al., "Binding of, and Energy Transfer Studies from Retinal to Organic Cations in Regenerated reduced Bacteriorhodopsin" *J. Phys. Chem.*, 98(37), 9939–44, 1994.

Wu et al., Binding Characteristics of an Organo–Metallic Cation, Ru(bpy)$3^{2y}$, in Regenerated Bacteriorhodopsin. *J. Phys. Chem.*, 98(30), 7246–51, 1994.

"Protein–Based Computers", Scientific American, Robert R. Birge, Mar. 1995, vol. 272, No. 3, pp. 90–95.

"Protein–Based Volumetric Memories", Int'l. Non Volatile Memory Technology Conference, Jeffrey A. Stuart, et al., Mar. 1996, pp. 45–51.

"Protein–Based Artificial Retinas", Reprinted from Trends in Biotechnology, Zhongping Chen and Robert R. Birge, Jul. 1993, vol. 11, pp. 292–300.

*Primary Examiner*—Cecilia J. Tsang
*Assistant Examiner*—C. Delacroix-Muirheid
*Attorney, Agent, or Firm*—Wall Marjama Bilinski & Burr

[57] ABSTRACT

A method of preparing an analog of bacteriorhodopsin in which organic cations selectively replace calcium and magnesium cations. The method comprises preparing a cation-free blue membrane and incubating the blue membrane with an organic cation selected from the group consisting of monovalent quaternary ammonium cations, bolaform cations and pyridinal cations.

9 Claims, 2 Drawing Sheets

Monovalent Organic Cations

R=Me, Et, Pr, Bu n = 3, 4, 6, 8, 10, 12

Bivalent Organic Cations

R= Me (n=2, 3, 4)
R= Et (n= 2, 3, 4)
R= Pr (n= 2, 3, 4)

n = 2, 4, 6, 8, 10, 12

Trivalent Organic Cations

R = Me, Et, Pr
{m,n} ={2,2},{2,3},{3,3},{3,4}
{m,n} ={2,4},{2,6},{2,8},{3,6},{3,8}

ANALOG BACTERIORHODOPSIN MOLECULES

BACKGROUND OF THE INVENTION

The invention described herein was a result of funding by The National Institutes of Health, grant number GM-34548, (R. R. Birge, principal investigator).

1. Field of the Invention

This invention relates generally to molecular electronics and the use of photosensitive chemicals in digital optical memories and artificial retinas, and specifically relates to the photosensitive protein molecule, bacteriorhodopsin.

2. Discussion of the Related Art

Photochemical reactions are highly specific reactions with varied and specific products. In the biological field, the existence of microbes capable of utilizing light energy to drive the synthesis of cellular components has been known since the late 19th century. Many proteins in nature serve the function of transporting ions across some medium, such as transporting protons from the interior of the bacterial cell to the exterior in a cyclic process to create a proton current. The proton gradient is used to generate adenosine triphosphate (ATP), necessary for energy storage and cell synthesis. One such protein found in nature is bacteriorhodopsin, which is a relatively small (about 4000 atoms) membrane protein found in the membrane of *Halobacterium salinarium*. When struck by light, the protein changes its structure and transports a proton across the membrane, thereby supplying energy to maintain cell metabolism.

The photochemistry of bacteriorhodopsin is mediated by a retinal chromophore which is bound to the protein via a protonated Schiff base linkage to LYS216. Upon the absorption of light, bacteriorhodopsin converts from a dark-adapted state containing a mixture of 13-cis and all-trans chromophores to a light-adapted state which contains only the all-trans chromophore. The photocycle of light-adapted bacteriorhodopsin is responsible for the proton pumping capability of the protein.

The functioning of bacteriorhodopsin as an optical material requires the presence of $Ca^{2+}$ and $Mg^{2+}$ ions which are bound at specific binding sites both inside the protein structure and on the protein surface. It is believed that there are two high affinity binding sites and four low affinity binding sites at various locations about the molecule. Removal of the calcium and magnesium cations from the native bacteriorhodopsin purple membrane produces the blue membrane, a protein which lacks a photocycle and which does not pump protons. It is known in the art that the optical and photochemical properties of the protein can be restored by adding either calcium or magnesium to an aqueous solution of the blue membrane.

As described above, photochemicals have been identified, studied, and used in various industries. One area that is of particular interest is the use of bacteriorhodopsin in the computer industry. In the computer industry, computer memory is a limiting factor of today's computer technologies. Optical data storage, particularly three dimensional optical data storage, offers many advantages over conventional two dimensional technologies with respect to storage capacity, cost and access time. A discussion of optical memory storage and protein-based computers is contained in the article, "Protein-Based Computers", *Scientific American*, Vol. 272, No. 3, March 1995, which is incorporated herein by reference.

A three dimensional optical memory device utilizing a film of bacteriorhodopsin is described in U.S. Pat. No. 5,253,198 to Birge et al., owned by a common assignee and incorporated herein by reference. An optical random access memory utilizing photosensitive chemicals is described in U.S. Pat. No. 5,228,001 to Birge et al., also incorporated herein by reference. The device described therein provides a high-speed optical random access memory that can employ a laser of low to moderate power for write, read and erase operations.

One drawback in the use of bacteriorhodopsin is low quantum efficiency of the data write process, which is on the order of $10^{-4}$ for the O–P photochemical transformation. Another drawback is the low yield of the O intermediate in the native protein at ambient temperatures. Therefore, there is a need to increase the yield of the O state so that enhanced photochemical conversion into the P state can be realized.

Another use of bacteriorhodopsin is in artificial retinas. The use of bacteriorhodopsin in artificial retinas is described in the article "Protein-based Artificial Retinas," Chen, Zhongping and Birge, Robert R., *Trends in Biotechnology*, July 1993. One drawback of this use of bacteriorhodopsin is that the protein film poisons the semiconductor due to the leaching of the calcium and magnesium metal cations from the bacteriorhodopsin molecule into the semiconductor surface.

OBJECTS AND SUMMARY OF THE INVENTION

It is an object of the present invention to provide a form of bacteriorhodopsin that has a more stable intermediate in its photocycle.

It is another object of the present invention to provide a form of bacteriorhodopsin that has an intermediate in its photocycle with an increased lifetime.

It is a further object of the present invention to provide a composition of bacteriorhodopsin that has an increased yield of the O intermediate in the photocycle.

It is yet another object of the present invention to provide a compound for efficient use in digital optical data systems.

It is yet a further object of the present invention to provide a branched photocycle three dimensional computer memories based on bacteriorhodopsin.

These and other objects are attained by a composition of matter which comprises an analog of bacteriorhodopsin in which organic cations selectively replace calcium and magnesium cations, and where the organic cations are selected from the group consisting of monoquaternary ammonium cations, bolaform cations and pyridinal cations.

BRIEF DESCRIPTION OF THE DRAWINGS

For a fuller understanding of the nature and objects of the invention, reference should be made to the following detailed description of a preferred mode of practicing the invention, read in connection with the accompanying drawings, in which.

DETAILED DESCRIPTION OF THE INVENTION

The major impact of molecular electronics on computer hardware is in the area of volumetric memory. There are three different types of protein based volumetric memories:

holographic, simultaneous two-photon and sequential one-photon. The current invention is used in the sequential one-photon process.

Figure 1:
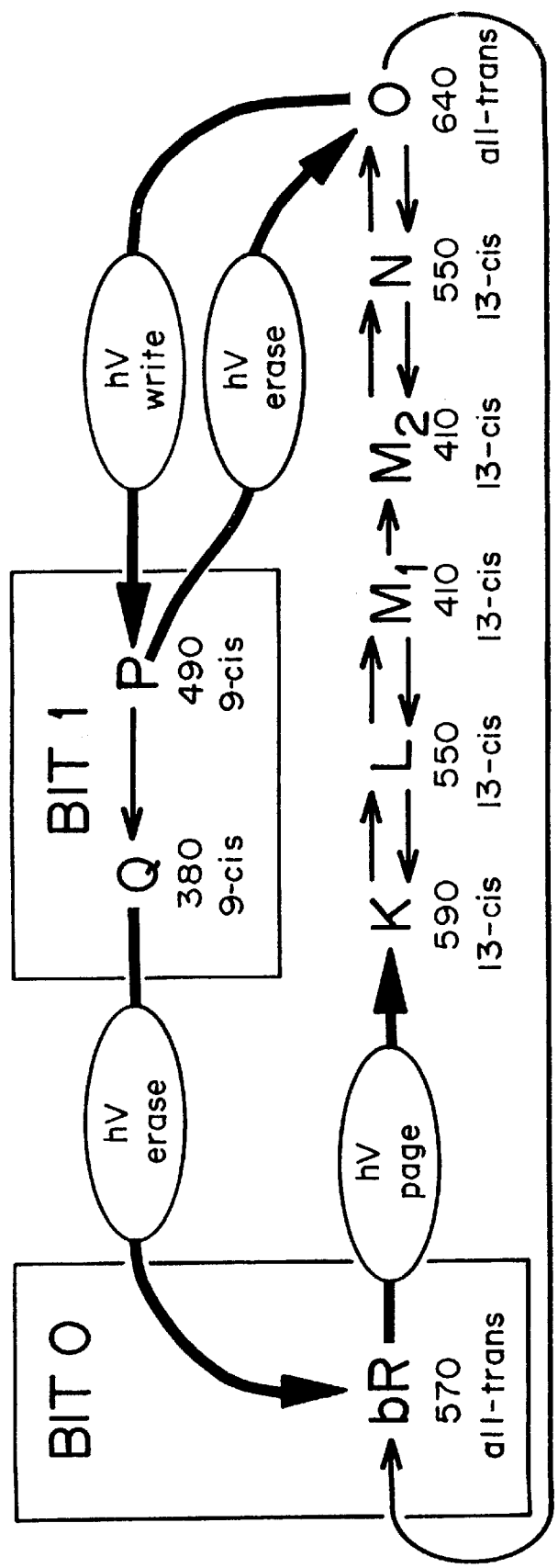
FIG. 1 is a block diagram depicting the branched photocycle of bacteriorhodopsin.

Bacteriorhodopsin has a photocycle that is conducive to its use in a sequential one-photon protein based volumetric memory. Referring now to FIG. 1, there is shown the branched photocycle of bacteriorhodopsin. When the all-trans retinyl chromophore in bacteriorhodopsin absorbs light, it initiates a photocycle involving changes in both the bound chromophore (all-trans or 13-cis conformations) and the surrounding protein. The principal intermediates of the photocycle are shown in FIG. 1, where the absorption maximum (in nanometers) and the conformation of the chromophore are listed below the intermediate label.

An unusual photophysical characteristic of the protein involves the final intermediate in the main photocycle, O, which when irradiated with light will divert the protein from the main photocycle into a branched photocycle characterized by an all-trans to 9-cis photochemical transformation of the chromophore. Although there are only two intermediates in the branched photocycle, P and Q, the utility of this branching reaction rests in the stability of Q ($\tau \geq 5$ years). If the resting state, bR, is assigned to bit 0 and both the P and Q to bit 1, there is the basis for long-term three-dimensional data storage. Furthermore, the use of one-photon (versus two photon) activation decreases by many orders of magnitude the intensities of light that are required to write data. Heretofore, the advantages of this photocycle for use in optical computing were limited by the lifetime of the O intermediate and the fact that the yield of the O intermediate is relatively low. It has been discovered that the replacement of the calcium and magnesium cations with large organic cations produces analog proteins that increase the lifetime of the O intermediate and increase the yield of the O intermediate.

Figure 2:
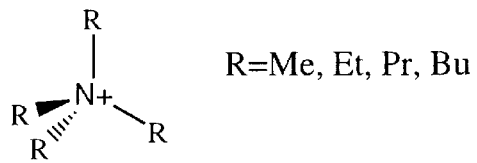
FIG. 2 is a diagram illustrating the chemical formulae of organic cations.
Figure 2:
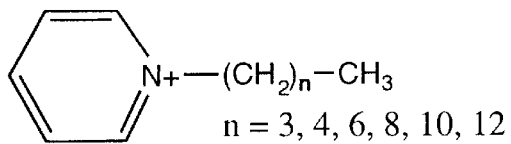
Figure 2:
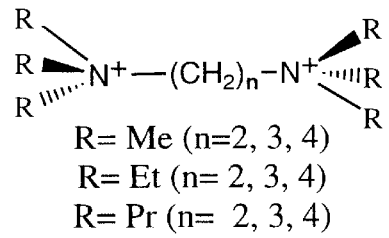
Figure 2:
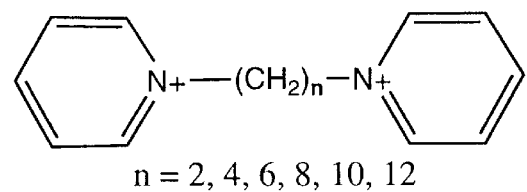
Figure 2:
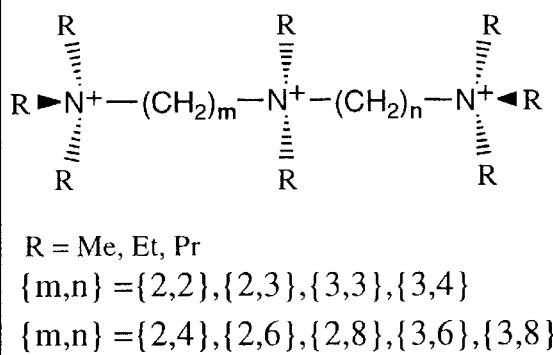

A suitable method of replacing the calcium and magnesium cations with large organic cations to produce the analog proteins begins with the preparation of the organic cation which is to be incorporated into the bacteriorhodopsin molecule. The organic cations that are incorporated into the bacteriorhodopsin molecule, while maintaining the photosensitive properties of the molecule, include monovalent, divalent, and trivalent organic cations. Preferably, the organic cations are selected from the group consisting of monoquaternary cations, bolaform cations and pyridinal cations. Examples of cations that have to date been examined are depicted in FIG. 2. It is understood by those in the art that specific photosensitive properties may be slightly manipulated by the judicious selection of different organic cations of various sizes.

The details of preparing the organic molecule follow standard methods to produce pure, white-crystalline powder, except in the case of the preparation of $N^+(CH_3)_3$—$CH_2$—$CH_2$—$N^+(CH_3)_3$ which is prepared in the following manner. A slight excess of methanolic iodomethane is added dropwise into a methanolic solution of tetramethylethylenediamine. The mixture is left to stand for approximately one hour. The crude product which precipitates is filtered off, washed three times with cold methanol and recrystallized three times from methanol to yield the desired white-crystalline product.

Next, the bacteriorhodopsin protein molecule is prepared. As is known in the art, the bacteriorhodopsin is isolated from two "overproducing" variants of Halobacterium halobium. Whereas the wild-type bacteria will only produce bacteriorhodopsin in its native form under the appropriate physiological conditions (anaerobic conditions in the presence of steady illumination), the above variants produce large quantities of purple membrane with high concentrations of dissolved oxygen and without illumination. The bacteria are grown at 40° C. and the growth medium is prepared by adding the following reagents per liter of solution in the order given: NaCl(250 g), $MgSO_4$(9.77 g), KCL (2 g), $NH_4Cl$(5 g), sodium citrate●$2H_2O$(3 g), glycerol (1 ml), $KH_2PO_4$(100 mg), anhydrous $CaCl_2$(0.2 g), and Oxoid Bacteriological Peptone L-37® (Oxoid Limited, Basingstoke, Hampshire, England)(10 g). The broth is adjusted to a pH between 7.0 and 7.4 by adding solid NaOH pellets. After the fermenter equilibrates to a temperature of 40° C., it is inoculated with 200–250 ml of the variant bacterial culture. The broth is continuously aerated at 3.0 liters/min and rotational agitation at about 300 rpm is maintained throughout the roughly seven day growth cycle. Antifoam A (Dow Corning®) is used as needed to control foaming. Growth of the bacteria is monitored by observing the absorbance at 600 nm and the purple membrane production is monitored by observing the absorbance at 570 nm. Cell harvesting is performed when the culture reaches the pre-stationary growth phase (at an absorbance at 570 nm of about 3.0 absorbance units). The protein (purple membrane) is isolated and purified by the following process: 1. The cells are spun down by centrifuging the culture broth at 10,000 rpm for 10 minutes, the pellet is washed with 4 $\underline{M}$ NaCl and resuspended in a minimal amount of 4 $\underline{M}$ NaCl; 2. the resuspended pellet is adjusted to 1 mM in $MgSO_4$, 0.1 mg/ml Dnase I is added and the solution stirred for ~15 hours at room temperature; 3. the resulting solution is then dialyzed against distilled water at 4° C. for 24 hours changing the water a minimum of six times; 4. the dialysate is spun down at 5000 rpm for 15 minutes, the pellet at the bottom (cell debris) is thrown out and the supernatant (suspended purple membrane) is pelleted at 15,000 rpm for 20 minutes; 5. the pellet (which now contains the purple membrane) is resuspended in minimal distilled water and 7 ml portions of the concentrated sample are placed onto a sucrose gradient with the following profile (4 ml: 20% sucrose; 13 ml: 36% sucrose; 9 ml: 40% sucrose; 4 ml: 46% sucrose) and ultracentrifuged using a swinging bucket rotor for 18 hours at 20,000 rpm at 4° C.; 6. the purple membrane residing in the 40% sucrose layer is collected after gently removing the orange band of carotenoids in the upper 36% sucrose layer; 7. the purple membrane is concentrated by pelleting it at 40,000 rpm for one hour at 4° C. and resuspended in a minimal amount of distilled water; 8. the solution is dialyzed against distilled water at 4° C. for 24 hours (changing the water six times); 9. the dialysate is pelleted at 43,000 rpm for one hour at 4° and resuspended in a minimal amount of distilled water. After the sucrose density gradient, the purple membrane was occasionally stored in the ~40% sucrose solution prior to carrying out steps 7 and 8. The purple membrane is stable in ~40% sucrose for an extended period of time (over six months).

The cation-free blue membrane is now prepared, and two different methods to prepare the cation-free blue membrane, EDTA complexation and cation exchange, are now described. In the first method, bacteriorhodopsin (~20 μM) is suspended in 10 mM EDTA and 50 mM Tris-HCl buffer (pH=8.0). The solution is stirred for 5 hours at room temperature. Then the solution is washed 15 times with deionized distilled water followed by centrifugation (1 hour at 20,000 rpm) to form the blue membrane solution. Plastic containers are used to store the blue membrane solution to avoid possible leaching of cations from standard glassware.

The second method of preparing the cation-free blue membrane is the cation exchange method. In the cation exchange method, well-washed cation exchange resin (Bio-Rad AG 50 W-X8) is added to bR solution and gently stirred for 5 hours to form the blue membrane solution. The pH of the filtered solution (pH=3.9–4.3) was lower than that observed for the EDTA method described above, and the absorption maximum was consistently at a lower wavelength (598–602 nm). Blue membrane solution prepared by using the cation exchange method showed visible signs of denaturation after three days of storage in the refrigerator and thus only freshly prepared units can be used.

Despite the above differences in the blue membrane solutions, addition of organic cations produced analog proteins which were invariant to blue membrane preparation method. Both methods differ primarily in the acidity of the final preparation. The small differences in the absorption maxima as a function of the preparation may effect a pH dependence of the protein conformation or a difference in the purity of the preparation. However, analog proteins prepared by using blue membrane from either preparative method appear to be identical.

The final step in preparing the analog protein is directly incubating the cation free blue membrane with the organic cation. Typically, the blue membrane is incubated for approximately 2 hours with 0.4 M of the monovalent organic cation or 0.02 M of the divalent cation. The resulting analog protein, a bacteriorhodopsin molecule with the metallic cations replaced by organic cations, has unexpected and useful properties. The analog protein significantly increases the lifetime of the O state. In addition and perhaps more importantly, the organic cations enhance the yield of the O state by factors as large as five. These enhancements to the protein have particular utility in the optical computer memory field, particularly in the use of a branched photocycle volumetric memory as described above.

A preferred application of the analog proteins of the current invention is in the field of three dimensional optical memories. The preparation of the analog proteins can take place in situ during the manufacture of the data cuvettes or cubes that are used in the volumetric memory. The protein is entrapped in a sonicated polyacrylamide gel sealed in a small polymethylmethacrylate cuvette of length and width approximately 1 cm and height approximately 2 cm. Maintenance of polymer water content is critical to stabilization of the photochemical properties of the protein-polymer matrix.

The cubes are produced by suspending purple membrane in a polymer matrix. The matrix must be sufficiently rigid to encapsulate the purple membrane and trap it in place, while providing enough moisture to ensure it retains its full activity. It also must provide a high degree of optical clarity and homogeneity for proper functioning of the optical memory. The polymer matrix must be rigid enough to prevent protein migration, but flexible enough to permit the protein to undergo modest changes in volume that take place during the photocycle.

The preferred polymer matrix is formed using polyacrylamide. The incorporation of bR into polymer gel helps avoid aggregation of the protein during the regeneration of bR from the blue membrane with the addition of the organic cations. Initially, a 20% (w/v) stock solution of acrylamide/bis acrylamide (95:5) in water is prepared. Then concentrated bR solution is added in a 1:1 ratio to the acrylamide solution. The solution is briefly sonicated and degassed under vacuum for ~1 hour (oxygen inhibits polymerization). Approximately 0.04% and 0.03% of ammonium persulfate and tetramethylethylenediamine respectively are added. The solution is stirred and then poured into a mold which consists of two glass plates separated by a Teflon spacer. The solution is left to stand for 1 hour for the completion of the polymerization process. The purple gels are cut into small pieces and kept soaked in deionized distilled water until use. The purple gel is stable and does not degrade over a period of years.

The bacteriorhodopsin in the gel is converted to blue membrane by stirring the gel with well-washed cation exchange resin for ~5 hours. Regeneration of bR is achieved by directly incubating the blue membrane gel with the organic cation. The advantage of using this method is that he regenerated protein is optically clear in the gel without aggregation. In addition, the photocycle and stability of bR is maintained. The blue membrane gel is first incubated for ~2 hours with 0.4 M or 0.02 M of the monovalent or divalent cations respectively. Then 4 mM Tris-HCl buffer solution (pH—7.6) is added and the gel is left to stand for 4 more hours. Gels that were titrated to pH—7.6 with NaOH give identical results indicating that the photocycle of bR is unaffected by the presence of this buffer species at the specified experimental conditions.

While this invention has been explained with reference to the structure disclosed herein, it is not confined to the details as set forth and this application is intended to cover any modifications and changes as may come within the scope of the following claims.

What is claimed is:

1. A data cuvette for use in digital optical memories, said data cuvette comprising:

a cuvette;

an analog of bacteriorhodopsin in which organic cations selectively replace calcium and magnesium cations; and, a polymer matrix wherein said analog is suspended in said polymer matrix and placed into said cuvette.

2. The data cuvette of claim 1 wherein said organic cation is selected from the group consisting of monovalent organic cations, divalent organic cations, and trivalent organic cations.

3. The data cuvette of claim 1 wherein said organic cation is selected from the group consisting of monoquaternary ammonium cations, bolaform cations and pyridinal cations.

4. A method of preparing a data cuvette for use in digital optical memories, said method comprising:

preparing a polymer matrix solution in water;

adding bacteriorhodopsin to said solution;

adding polymerizing agents to said solution;

pouring said solution into a mold and allowing said solution to stand for a period of time sufficient to allow polymerization into a gel;

stirring said gel in a cation exchange resin;

incubating said gel with an organic cation;

adding buffer solution;

fragmenting said gel into pieces and soaking said pieces in deionized water;

delivering said gel into the cuvette; and, sealing said cuvette so that it is air-tight.

5. The method of claim 4 wherein said organic cation is selected from the group consisting of monovalent organic cations, divalent organic cations, and trivalent organic cations.

6. The method of claim 4 wherein said organic cation is selected from the group consisting of monoquaternary ammonium cations, bolaform cations and pyridinal cations.

7. A method of preparing a data cuvette for use in optical computing memory, said method comprising:

preparing an acrylamide/bis acrylamide solution in water;

adding bacteriorhodopsin in a 1:1 ratio to said solution;

sonicating and degassing said solution under vacuum;

adding ammonium persulfate to said solution;

adding tetramethylethylenediamine to said solution;

pouring said solution into mold and allowing said solution to stand for a period of time sufficient to allow polymerization into a gel;

stirring said gel in a cation exchange resin;

incubating said gel with an organic cation;

adding 4 mM Tris-HCL buffer solution;

cutting said gel into pieces and soaking said pieces in deionized water;

delivering said gel into the cuvette; and, sealing said cuvette so that it is air-tight.

8. The method of claim 7 wherein said organic cations is selected from the group consisting of monovalent organic cations, divalent organic cations and trivalent organic cations.

9. The method of claim 7 wherein said organic cation is selected from the group consisting of monoquaternary ammonium cations, bolaform cations and pyridinal cations.

\* \* \* \* \*